United States Patent
Lee et al.

(10) Patent No.: US 10,951,071 B2
(45) Date of Patent: Mar. 16, 2021

(54) WIRELESS CHARGING SYSTEM FOR USING FREQUENCY CONTROL

(71) Applicant: CENTER FOR INTEGRATED SMART SENSORS FOUNDATION, Daejeon (KR)

(72) Inventors: Kyung Hak Lee, Gyeonggi-do (KR); Young Ki Kim, Daejeon (KR); Jae Hyun Choi, Seoul (KR); Hyun Wook Lee, Daejeon (KR)

(73) Assignee: CENTER FOR INTEGRATED SMART SENSORS FOUNDATION, Daejeon (KR)

(*) Notice: Subject to any disclaimer, the term of this patent is extended or adjusted under 35 U.S.C. 154(b) by 352 days.

(21) Appl. No.: 15/953,148

(22) Filed: Apr. 13, 2018

(65) Prior Publication Data

US 2018/0309454 A1     Oct. 25, 2018

(30) Foreign Application Priority Data

Apr. 19, 2017 (KR) .................. 10-2017-0050452

(51) Int. Cl.
*H02J 50/40* (2016.01)
*H02J 50/12* (2016.01)
*H02J 50/20* (2016.01)
*H02J 50/10* (2016.01)
*H02J 7/00* (2006.01)
*H02J 7/02* (2016.01)
(Continued)

(52) U.S. Cl.
CPC ............ *H02J 50/40* (2016.02); *H02J 7/0013* (2013.01); *H02J 7/025* (2013.01); *H02J 50/10* (2016.02); *H02J 50/12* (2016.02); *H02J 50/20* (2016.02); *H03L 7/0802* (2013.01); *H02J 50/80* (2016.02)

(58) Field of Classification Search
CPC .......... H02J 7/0013; H02J 50/20; H02J 50/40; H03L 7/0802
USPC .................. 320/108, 142, 155; 307/104, 149
See application file for complete search history.

(56) References Cited

U.S. PATENT DOCUMENTS

| 2010/0033021 A1 | 2/2010 | Bennett |
| 2011/0156640 A1* | 6/2011 | Moshfeghi .......... H02J 7/00302 320/108 |

(Continued)

FOREIGN PATENT DOCUMENTS

| JP | 2014-180210 A | 9/2014 |
| KR | 10-2013-0087976 A | 8/2013 |

(Continued)

OTHER PUBLICATIONS

European Search Report of European Application No. 18167869.9 dated Aug. 30, 2018.

*Primary Examiner* — Edward Tso
*Assistant Examiner* — Aaron Piggush
(74) *Attorney, Agent, or Firm* — Blank Rome LLP

(57) ABSTRACT

Disclosed is a transmitter used for a wireless charging system. The transmitter includes a plurality of phase locked loops (PLLs) that outputs single-phase power signals, a plurality of antennas that transmits power signals transmitted from the plurality of PLLs to a receiver, and a controller that determines a specific frequency for the receiver based on a signal strength indication (RSSI) received from the receiver and allows output frequencies of the plurality of PLLs to be different from each other in a specific frequency band preset based on the specific frequency.

13 Claims, 6 Drawing Sheets

(51) Int. Cl.
*H03L 7/08* (2006.01)
*H02J 50/80* (2016.01)

(56) References Cited

U.S. PATENT DOCUMENTS

| | | | | |
|---|---|---|---|---|
| 2014/0368048 | A1* | 12/2014 | Leabman | H04W 52/38 |
| | | | | 307/104 |
| 2016/0126753 | A1* | 5/2016 | Wight | H02J 50/90 |
| | | | | 342/369 |
| 2017/0187198 | A1* | 6/2017 | Leabman | G01S 13/88 |

FOREIGN PATENT DOCUMENTS

| | | |
|---|---|---|
| WO | WO 2007/084716 A2 | 7/2007 |
| WO | WO 2014/075103 A1 | 5/2014 |
| WO | WO 2015 077730 A1 | 5/2015 |

* cited by examiner

WIRELESS CHARGING SYSTEM FOR USING FREQUENCY CONTROL

CROSS-REFERENCE TO RELATED APPLICATIONS

A claim for priority under 35 U.S.C. § 119 is made to Korean Patent Application No. 10-2017-0050452 filed on Apr. 19, 2017, in the Korean Intellectual Property Office, the entire contents of which are hereby incorporated by reference.

BACKGROUND

Embodiments of the inventive concept described herein relate to a wireless charging system for using a frequency control, and more particularly, relate to a technology of controlling and transmitting a power signal to have a frequency suitable for a receiver.

In recent years, as various portable terminals using wireless communication have been widely spread, wireless charging technology for wirelessly charging a portable terminal has also been actively developed.

The wireless charging technology is a technique for charging a portable terminal with a power signal transmitted from a wireless charging transmitter in one of an induction scheme, a resonance scheme, and an RF wireless charging scheme, where a wireless charging receiver is embedded in the portable terminal such that the power signal used for charging the portable terminal is received from the wireless charging transmitter.

In such a conventional wireless charging technology, in consideration of reflection by various structures located in an indoor space under a wireless environment, which is mainly an indoor space, a plurality of wireless charging transmitters transmit power signals in a plurality of phases such that a wireless charging receiver receives the power signals transmitted from the wireless charging transmitters.

However, conventional wireless charging technology only considers whether the wireless charging receiver can receive the power signal transmitted from the wireless charging transmitter, and does not consider the charging efficiency (gain) of the wireless charging receiver at the frequency of the power signal.

Therefore, the following embodiments propose a technique for controlling and transmitting a power signal at a frequency suitable for a wireless charging receiver in consideration of the charging efficiency of the wireless charging receiver.

SUMMARY

Embodiments of the inventive concept provide a transmitter that controls a power signal in consideration of the charging efficiency of a receiver such that the power signal has a frequency suitable for the receiver, and a wireless charging system including the same.

In detail, embodiments of the inventive concept provide a transmitter and a wireless charging system including the same, where the transmitter determines a specific frequency for a receiver based on a received signal strength indication (RSSI) received from the receiver, and controls output frequencies of a plurality of PLLs included in the transmitter in a specific frequency band preset based on a specific frequency, such that the output frequencies are different from each other to transmit power signals having mutually different frequencies to the receiver.

Specifically, embodiments of the inventive concept provide a transmitter that sets output frequencies of a plurality of PLLs to different stepped values in a specific frequency band, and a wireless charging system including the same.

In this case, embodiments of the inventive concept provide a transmitter that determines a specific frequency based on the frequency that maximizes the charge power of a receiver or based on information about the frequency that the receiver is using, and a wireless charging system including the same.

In addition, embodiments of the inventive concept provide a transmitter that is arranged based on a position or shape of a structure in a space such that power signals are reflected and transmitted to a receiver, and a wireless charging system including the same.

According to an aspect of an embodiment, a transmitter used for a wireless charging system includes a plurality of phase locked loops (PLLs) that outputs single-phase power signals, a plurality of antennas that transmits power signals transmitted from the plurality of PLLs to a receiver, and a controller that determines a specific frequency for the receiver based on a signal strength indication (RSSI) received from the receiver and allows output frequencies of the plurality of PLLs to be different from each other in a specific frequency band preset based on the specific frequency.

The output frequencies of the plurality of PLLs may be set to different stepped values in the specific frequency band.

The plurality of PLLs may output the power signals having mutually different frequencies corresponding to the output frequencies which are controlled by the controller such that the output frequencies are different from each other.

The controller may determine, as the specific frequency, a frequency that maximizes a charging power of the receiver, based on the RSSI.

The controller may determine the specific frequency based on information about a frequency being used by the receiver, where the information is included in the RSSI.

The controller may determine, as the specific frequency, a frequency that maximizes a charging power of the receiver in a frequency band other than the frequency being used by the receiver.

The controller may control input frequencies of the plurality of PLLs such that the output frequencies of the plurality of PLLs are different from each other in the specific frequency band.

The output frequencies of the plurality of PLLs may be different from each other in the specific frequency band without regard to an input frequency.

The transmitter may further include a communication antenna configured to receive the RSSI from the receiver.

The transmitter may further include at least one power amplifier arranged between the plurality of PLLs and the plurality of antennas to amplify the power signals transmitted from the plurality of PLLs.

The transmitter may be arranged based on a location and a shape of a structure in a space in which the transmitter exists, such that the power signals are reflected on the structure and transmitted to the receiver.

According to another aspect of an embodiment, a transmitter used for a wireless charging system includes a plurality of phase locked loops (PLLs) that outputs single-phase power signals, a plurality of antennas that transmits the power signals transmitted from the plurality of PLLs to a plurality of receivers, and a controller that determines a specific frequency for each of the plurality of receivers based on a signal strength indication (RSSI) received from each of the plurality of receivers and allows output frequencies of the plurality of PLLs to be different from each other based on the specific frequencies of the plurality of receivers.

The controller may determine, as the specific frequencies of the plurality of receivers, frequencies that respectively maximize charging powers of the plurality of receivers, based on the RSSIs.

The controller may determine the specific frequency of each of the plurality of receivers based on a frequency being used by each of the plurality of receivers included in the RSSI.

According to still another aspect of an embodiment, a wireless charging system includes a transmitter and a receiver wirelessly charged by the transmitter, where the transmitter includes a plurality of phase locked loops (PLLs) that outputs single-phase power signals, a plurality of antennas that transmits power signals transmitted from the plurality of PLLs to a receiver, and a controller that determines a specific frequency for the receiver based on a signal strength indication (RSSI) received from the receiver and allows output frequencies of the plurality of PLLs to be different from each other in a specific frequency band preset based on the specific frequency.

According to still another aspect of an embodiment, a wireless charging system includes a transmitter and a plurality of receivers wirelessly charged by the transmitter, where the transmitter includes a plurality of phase locked loops (PLLs) that outputs single-phase power signals, a plurality of antennas that transmits power signals transmitted from the plurality of PLLs to the plurality of receivers, and a controller that determines a specific frequency for each of the plurality of receivers based on a signal strength indication (RSSI) received from each of the plurality of receivers and allows output frequencies of the plurality of PLLs to be different from each other based on the specific frequencies of the plurality of receivers.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
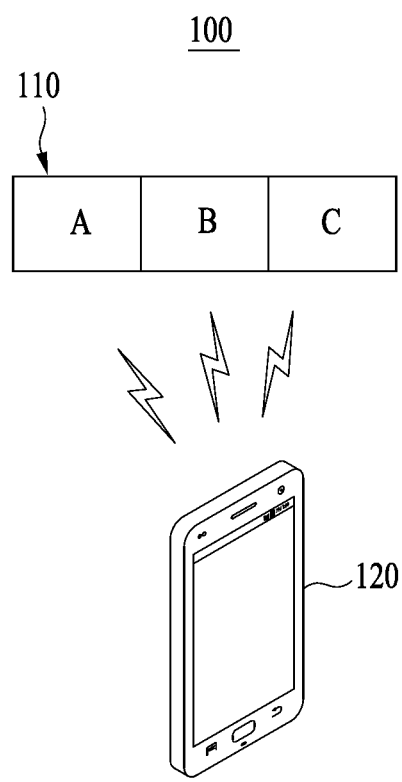
FIG. 1 is a view illustrating a wireless charging system according to an embodiment.

Hereinafter, embodiments of the inventive concept will be described in detail with reference to the accompanying drawings. However, it should be understood that the inventive concept is not limited to the following embodiments. In addition, the same reference numerals used in each drawing represent the same elements.

In addition, terminologies used herein are defined to appropriately describe the exemplary embodiments of the inventive concept and thus may be changed depending on a viewer, the intent of an operator, or a custom. Accordingly, the terminologies must be defined based on the following overall description of this disclosure.

FIG. 1 is a view illustrating a wireless charging system according to an embodiment.

Referring to FIG. 1, a wireless charging system 100 according to an embodiment includes a transmitter 110 and a receiver 120 wirelessly charged by the transmitter 110. Hereinafter, the receiver 120 is illustrated as a portable terminal, but the embodiment is not limited thereto and the receiver 120 means a module installed inside or outside the portable terminal to support wireless charging of the portable terminal. In addition, it is illustrated that the wireless charging system 100 includes one transmitter 110, but the embodiment is not limited thereto and the wireless charging system may include plural transmitters. In this case, each transmitter may have the same structure as the transmitter 110 that will be described below and perform the same operation as the transmitter 110. The wireless charging system 100 may include plural receivers corresponding to the plural transmitters.

The wireless charging system 100 may be arranged in various spaces (e.g., an indoor space in which wireless charging electronic devices exist) requiring wireless charging. In this case, various structures reflecting a wireless signal are located in the indoor space and the receiver 120 receives signals reflecting on the various structures included in the space. Thus, the transmitter 110 may be arranged in the space based on the position or shape of the structure such that the receiver 120 receives the power signals (which mean power signals which are output from the transmitter 110 and by which the receiver 120 has a gain higher than a reference value) sufficient to be charged.

The transmitter 110 transmits power signals, which are wireless charging power signals and implemented in the form of a pulse or a continuous wave (CW), at a plurality of frequencies. The receiver 120 receives the power signals having the frequencies such that the receiver 120 is wirelessly charged. Thus, as illustrated in the drawings, the transmitter 110 may include a plurality of antennas including antenna 'A', antenna 'B', antenna 'C', and the like such that the transmitter 110 transmits power signals having a plurality of frequencies. Although the antennas included in the transmitter 110 are illustrated as being arranged in a line, the embodiment is not limited thereto and the antennas may be arranged in various forms on the transmitter 110.

In this case, the receiver 120 has a specific frequency (e.g., 5.8 GHz) at which the charging power is maximized due to wireless charging characteristics. Thus, when the receiver 120 receives a power signal of a specific frequency, the charging efficiency is maximized. However, when a plurality of power signals having a specific frequency are received (e.g., when a plurality of power signals of 5.8 GHz are received), the power signals having the same frequency interfere with each other such that the charging power of the receiver 120 is reduced.

Thus, the transmitter 110 may receive an RSSI from the receiver 120 to determine a specific frequency for the receiver 120 and may transmit power signals, of which frequencies are set to be different from each other in a specific frequency band preset based on a specific frequency, to the receiver 120, such that the receiver 120 receives the power signals having mutually different frequencies based on the specific frequency instead of receiving power signals having the same frequency.

In this case, a frequency may be determined as the specific frequency for the receiver 120 such that the charging power of the receiver 120 is maximized (if the receiver 120 is using any one frequency, as the specific frequency, a frequency may be determined to maximize the charging power of the receiver 120 in the frequency band except the frequency in use).

The details of the structure of the transmitter 110 will be described with reference to FIG. 2.

As described above, the wireless charging system 100 according to an embodiment may transmit the power signals of the transmitter 110, of which frequencies are set to be different from each other in a specific frequency band preset based on a specific frequency at which the charging power of the receiver 120 is maximized, thereby maximizing the charging efficiency of the receiver 120.

Figure 2:
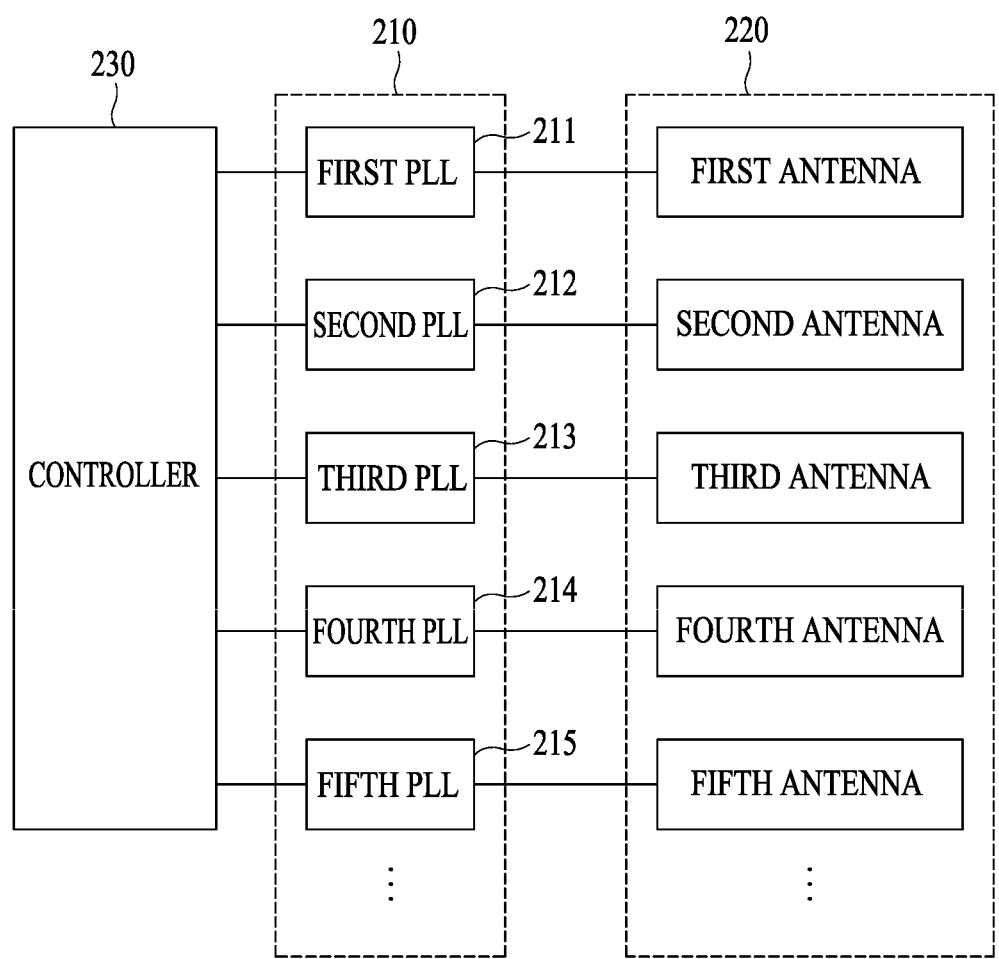
FIG. 2 is a block diagram illustrating a structure of a transmitter included in a wireless charging system according to an embodiment.
Figure 3:
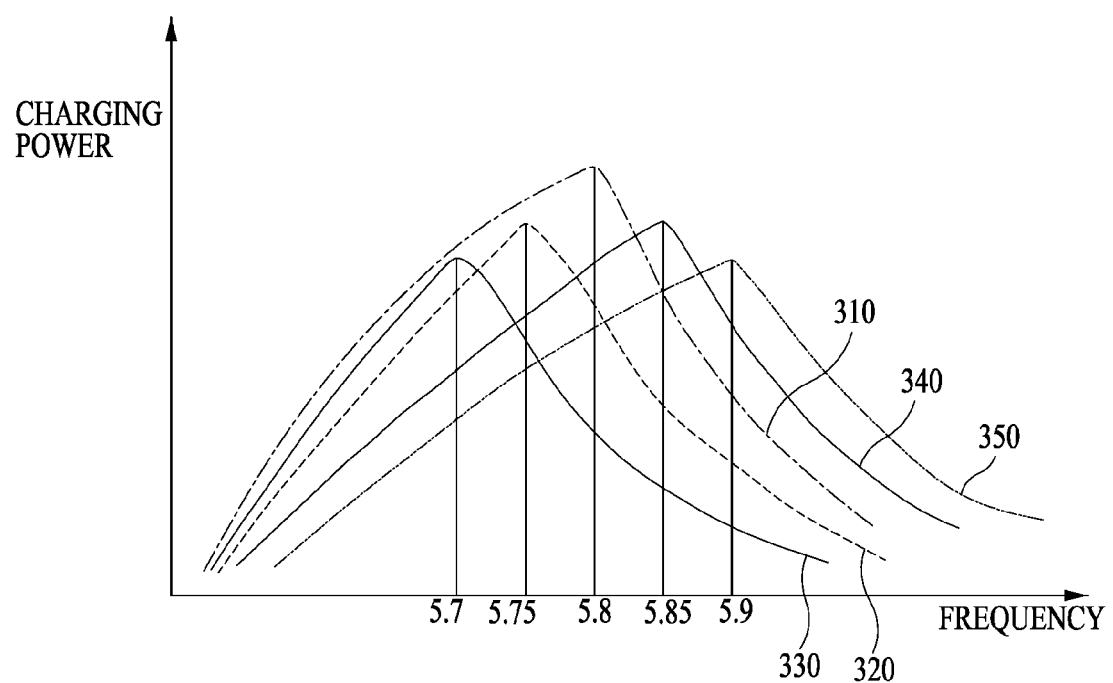
FIG. 3 is a view illustrating frequency characteristics of power signals transmitted from the transmitter illustrated in FIG. 2.

FIG. 2 is a block diagram illustrating a structure of a transmitter included in a wireless charging system according to an embodiment. FIG. 3 is a view illustrating frequency characteristics of power signals transmitted from the transmitter illustrated in FIG. 2.

Referring to FIGS. 2 and 3, a transmitter 200 according to an embodiment, which is included in the wireless charging system illustrated in FIG. 1, includes a plurality of phase locked loops (PLLs) 210, a plurality of antennas 220, and a controller 230 and performs an operation of charging a receiver.

The PLLs 210 output single-phase power signals. In this case, each of the PLLs 210, which is a circuit for outputting a fixed-phase frequency signal, may be a conventional PLL circuit that oscillates at an output frequency matched with an input frequency, or a circuit that oscillates at the output frequency without regard to the input frequency. The details will be described below.

Specifically, the PLLs 210 may output power signals which have the same phase and have mutually different output frequencies, so that the output power signals have mutually different frequencies. For example, the output frequency of a first PLL 211 of the PLLs 210 is set to 5.8 GHz and the output frequency of a second PLL 212 is set to 5.75 GHz, so that the first PLL 211 may output a power signal of 5.8 GHz and the second PLL 212 may output a power signal of 5.75 GHz. In this case, the power signal of 5.8 GHz output from the first PLL 211 and the power signal of 5.75 GHz output from the second PLL 212 have the same phase.

The controller 230 receives an RSSI from the receiver and determines a specific frequency for the receiver. In this case, since the RSSI includes information associated with a power value of the power signal received at the receiver, the controller 230 may check a frequency at which the charging power of the receiver is maximized, based on the RSSI of the receiver. Thus, the controller 230 determines, as the specific frequency, a frequency at which the charging power of the receiver is maximized, based on the RSSI, and controls the output frequencies of the PLLs 210 in a specific frequency band preset based on the specific frequency such that the output frequencies are different from each other.

In the wireless charging system, the receiver has the specific frequency at which the charging power is maximized. For example, as illustrated in FIG. 3, when the receiver has the maximum charging power by a power signal 310 of 5.8 GHz, the receiver has a charging power higher than a predetermined value even by power signals 320 to 350 in a frequency band (e.g., 5.7 GHz to 5.9 GHz) adjacent to 5.8 GHz.

Thus, the controller 230 may set the output frequencies of the PLLs 210 to different stepped values in the specific frequency band. For example, when it is checked that the frequency that maximizes the charging power of the receiver is 5.8 GHz, based on the RSSI of the receiver, the controller 230 may set the output frequencies of the PLLs 210 to different stepped values in a specific frequency band (e.g., 5.7 GHz to 5.9 GHz) preset based on 5.8 GHz. As a more detailed example, the controller 230 may set the output frequency of the first PLL 211 to 5.8 GHz, set the output frequency of the second PLL 212 to 5.75 GHz, set the output frequency of the third PLL 213 to 5.7 GHz, set the output frequency of the fourth PLL 214 to 5.85 GHz, and set the output frequency of the fifth PLL 215 to 5.9 GHz.

Under control of the controller 230, the PLLs 210 may output (transfer) the power signals (having the same phase) having mutually different frequencies to the antennas 220. For example, the first PLL 211 may output the power signal 310 of 5.8 GHz, the second PLL 212 may output the power signal 320 of 5.75 GHz, the third PLL 213 may output the power signal 330 of 5.7 GHz, the fourth PLL 214 may output the power signal 340 of 5.85 GHz, and the fifth PLL 215 may output the power signal 350 of 5.9 GHz.

Therefore, the receiver may receive power signals having mutually different frequencies without interference so that the charging efficiency is maximized.

In addition, the controller 230 may determine the specific frequency for the receiver in the frequency band other than the frequency being used by the receiver by checking the information about the frequency in use included in the RSSI received from the receiver. In this case, likewise, the controller 230 may determine, as the specific frequency, the frequency that maximizes the charging power of the receiver in the frequency band other than the frequency being used by the receiver.

The controller 230 may control the output frequency of each PLL 210 in various schemes. For example, in the case where each PLL 210 is a conventional PLL circuit which oscillates at an output frequency coinciding with an input frequency, the controller 230 may control the input frequencies of the PLLs 210 to be different from each other, such that the output frequencies of the PLLs 210 are set to be different from each other in a specific frequency band. As another example, in the case where each PLL 210 is a circuit that oscillates at an output frequency regardless of an input frequency, the controller 230 may transmit a control signal associated with information about a specific frequency band to each PLL 210, such that the output frequencies of the PLLs 210 are set to be different from each other in the specific frequency band. The detailed description of the circuit of each PLL 210 will be omitted because it is outside the technical scope of the inventive concept.

The antennas 220 transmit power signals (which have the same phase and mutually different frequencies), which are transmitted from the PLLs 210, to the receiver. Thus, the number of the antennas 220 may correspond to the number of the PLLs 210. In this case, each antenna 220 may include a matching unit corresponding to each PLL 210.

Although the embodiment including five PLLs 210 and five antennas 220 has been described above, the embodiment is not limited thereto and the transmitter 200 may be composed of at least two or more PLLs and antennas.

In addition, although not illustrated in the drawings, the transmitter 200 may further include a communication antenna for receiving the RSSI from the receiver. In this case, the transmitter 200 may receive the RSSI from the receiver through the communication antenna and transmit the power signals to the receiver through the antennas 220. However, the embodiment is not limited thereto, and the transmitter 200 may use one of the antennas 220 as the communication antenna and may transmit the power signals to the receiver through the other antennas.

In addition, although not illustrated in the drawings, the transmitter 200 may further include at least one power amplifier arranged between the PLLs 210 and the antennas 220 to amplify the power signals transmitted from the PLLs 210. For example, the transmitter 200 may include one power amplifier configured to amplify the power signals transmitted from the PLLs 210, but the embodiment is not limited thereto and the transmitter 200 may include a plurality of power amplifiers that correspond to the PLLs 210, respectively.

Figure 4:
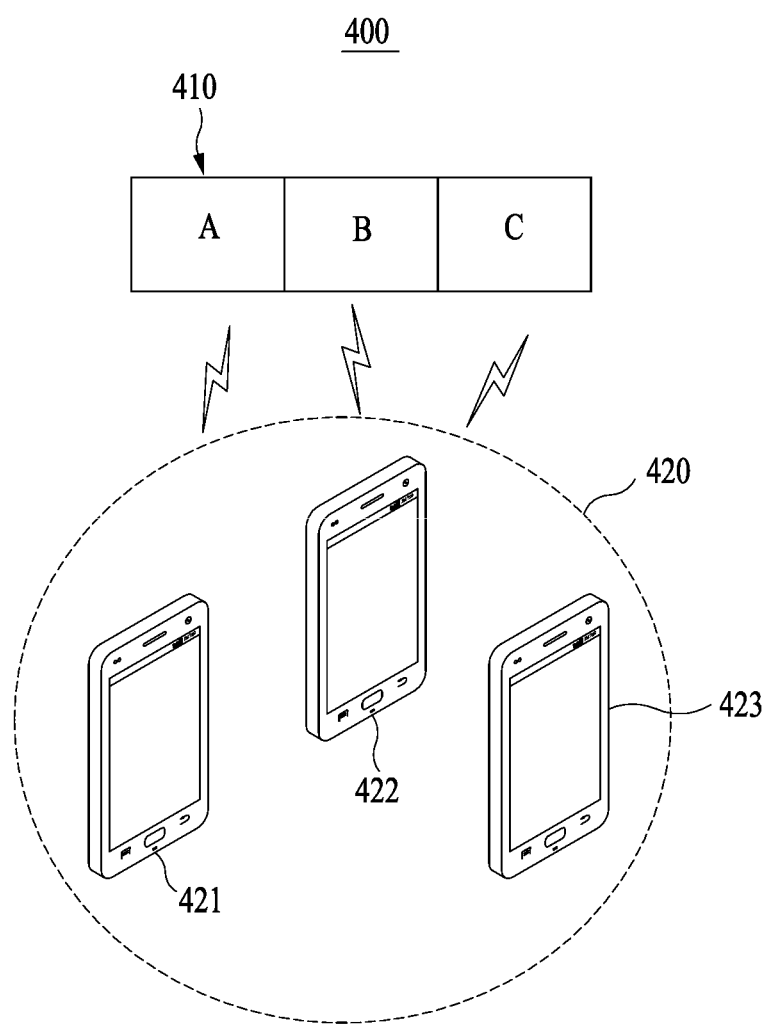
FIG. 4 is a view illustrating a wireless charging system according to another embodiment.

FIG. 4 is a view illustrating a wireless charging system according to another embodiment.

Referring to FIG. 4, a wireless charging system 400 according to another embodiment includes a transmitter 410 and a plurality of receivers 420 wirelessly charged by the transmitter 410. Hereinafter, each of the receivers 420 is illustrated as a portable terminal, but the embodiment is not limited thereto and each of the receivers 420 means a module installed inside or outside the portable terminal to support wireless charging of the portable terminal. In addition, it is illustrated that the wireless charging system 400 includes one transmitter 410, but the embodiment is not limited thereto and the wireless charging system 400 may include plural transmitters. In this case, each transmitter may have the same structure as the transmitter 410 and perform the same operation as the transmitter 410. The wireless charging system 400 may include sets of receivers which correspond to the transmitters, respectively. For example, the wireless charging system 400 may include a first set of receivers corresponding to a first transmitter and a second set of receivers corresponding to a second transmitter.

The wireless charging system 400 may be arranged in various spaces (e.g., an indoor space in which wireless charging electronic devices exist) requiring wireless charging. In this case, various structures reflecting a wireless signal are located in the indoor space and each of the receivers 420 receives signals reflecting on the various structures included in the space. Thus, the transmitter 410 may be arranged in the space based on the position or shape of the structure such that each of the receiver 420 receives the power signals (which mean power signals which are output from the transmitter 410 and by which each of the receivers 420 has a gain higher than a reference value) sufficient to be charged.

The transmitter 410 transmits power signals, which are wireless charging power signals and implemented in the form of a pulse or a continuous wave (CW), at a plurality of frequencies. Each of the receivers 420 receives the power signals having mutually different frequencies such that the receivers 420 are wirelessly charged. Thus, as illustrated in the drawings, the transmitter 410 may include a plurality of antennas including antenna 'A', antenna 'B', antenna 'C', and the like such that the transmitter 410 transmits power signals having a plurality of frequencies. Although the antennas included in the transmitter 410 are illustrated as being arranged in a line, the embodiment is not limited thereto and the antennas may be arranged in various forms on the transmitter 410.

In this case, each of the receivers 420 has a specific frequency (e.g., 5.8 GHz) at which the charging power is maximized due to wireless charging characteristics. For example, a first receiver 421 of the receivers 420 may have a frequency of 5.8 GHz that maximizes the charging power, a second receiver 422 may have a frequency of 4.8 GHz that maximizes the charging power, and a third receiver 423 may have a frequency of 6.8 GHz that maximizes the charging power. Thus, when each of the receivers 420 receives a power signal of a specific frequency, the charging efficiency is maximized.

Thus, the transmitter 410 may receive an RSSI from each of the receivers 420 to determine, as a specific frequency for each of the receivers 420, a frequency that maximizes the charging power of each of the receivers 420, and may transmit power signals, of which frequencies are set to the specific frequencies, to the receivers 420, such that each of the receivers 420 receives the power signal of the specific frequency that maximizes the charging power.

When any one of the receivers 420 is already using the frequency that maximizes the charging power, the transmitter 410 may determine, as the specific frequency of the corresponding receiver, a frequency that maximizes the charging power of the corresponding receiver in a frequency band other than the frequency in use.

In this case, when the frequencies maximizing the charging power of the receivers 420 are equal to each other, the receivers 420 receive the power signals having the same frequency, respectively, so that the charging power of each of the receivers 420 is lowered due to interference between the power signals having the same frequency.

Therefore, when the frequencies maximizing the charging power of the receivers 420 are equal to each other, the transmitter 410 may control the frequencies of the power signals such that the receivers having the same maximum charging power frequency receive power signals of mutually different frequencies, as described above with reference to FIGS. 1 to 3.

The details of the structure of the transmitter 410 will be described with reference to FIG. 5.

As described above, the wireless charging system 400 according to another embodiment may determine a frequency maximizing the charging power of each of the receivers 420 as the specific frequency of each of the receivers 420, and may transmit the power signals of the transmitter 410, of which frequencies are set to the specific frequencies of the receivers 420, respectively, thereby maximizing the charging efficiency of each of the receivers 420.

Figure 5:
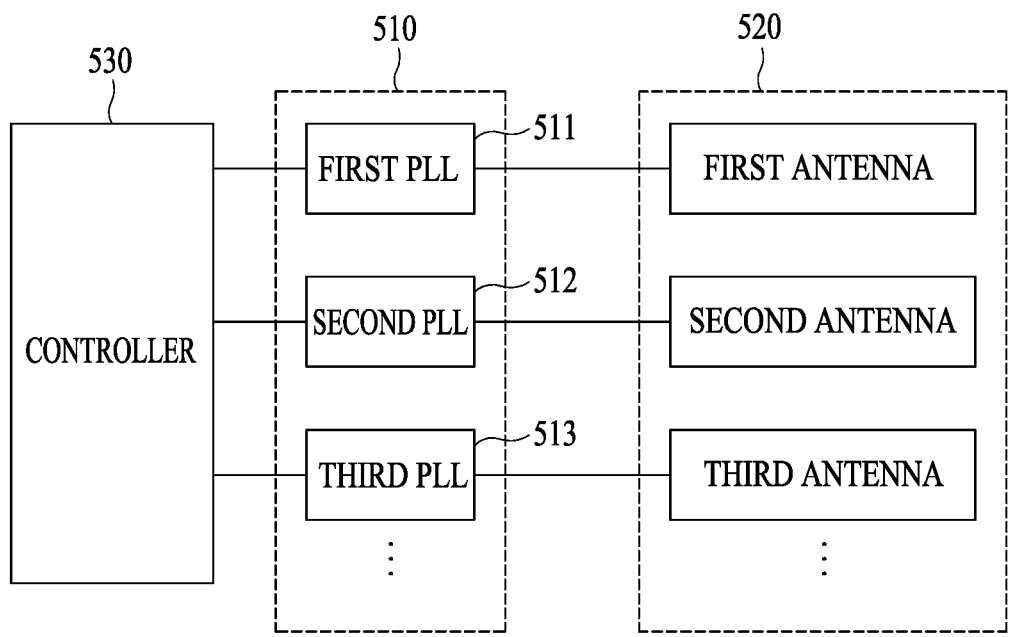
FIG. 5 is a block diagram illustrating a structure of a transmitter included in a wireless charging system according to another embodiment.
Figure 6:
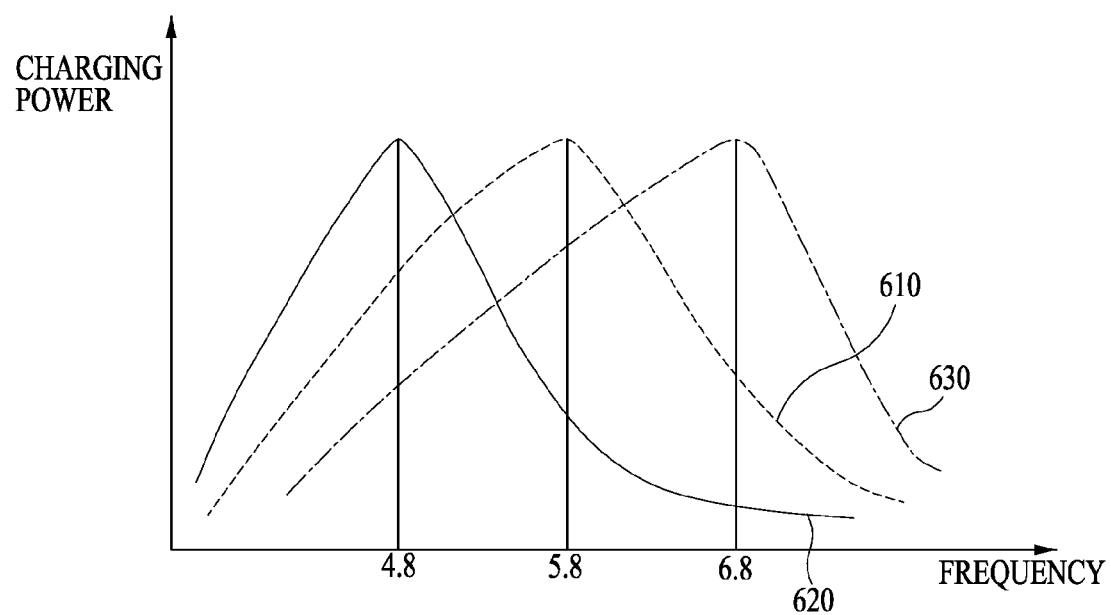
FIG. 6 is a view illustrating frequency characteristics of power signals transmitted from the transmitter illustrated in FIG. 5.

FIG. 5 is a block diagram illustrating a structure of a transmitter included in a wireless charging system according to another embodiment. FIG. 6 is a view illustrating frequency characteristics of power signals transmitted from the transmitter illustrated in FIG. 5.

Referring to FIGS. 5 and 6, a transmitter 500 according to another embodiment, which is included in the wireless charging system illustrated in FIG. 4, includes a plurality of phase locked loops (PLLs) 510, a plurality of antennas 520, and a controller 530 and performs an operation of charging a plurality of receivers.

The PLLs 510 output single-phase power signals. In this case, each of the PLLs 510, which is a circuit for outputting a fixed-phase frequency signal, may be a conventional PLL circuit that oscillates at an output frequency matched with an input frequency, or a circuit that oscillates at the output frequency without regard to the input frequency. The details will be described below.

Specifically, the PLLs 510 may output power signals which have the same phase and have mutually different output frequencies, so that the output power signals have mutually different frequencies. For example, the output frequency of a first PLL 511 of the PLLs 510 is set to 5.8 GHz and the output frequency of a second PLL 512 is set to 4.8 GHz, so that the first PLL 511 may output a power signal of 5.8 GHz and the second PLL 512 may output a power signal of 4.8 GHz. In this case, the power signal of 5.8 GHz output from the first PLL 511 and the power signal of 4.8 GHz output from the second PLL 512 have the same phase.

The controller 530 receives an RSSI from each of the receivers and determines a specific frequency for each of the receivers. In this case, since the RSSI includes information associated with a power value of the power signal received at the receiver, the controller 530 may check a frequency that maximizes the charging power of each of the receivers, based on the RSSI of each of the receivers. Thus, the controller 530 determines, as the specific frequency of each receiver, a frequency at which the charging power of each of the receivers is maximized, based on the RSSI, and controls the output frequencies of the PLLs 510 based on the specific frequencies of the receivers such that the output frequencies are different from each other.

In the wireless charging system, each of the receivers has the specific frequency that maximizes the charging power thereof. For example, as illustrated in FIG. 6, a first receiver of the receivers may have the maximum charging power by a power signal 610 of 5.8 GHz, a second receiver of the receivers may have the maximum charging power by a power signal 620 of 4.8 GHz, and a third receiver of the receivers may have the maximum charging power by a power signal 630 of 6.8 GHz.

Thus, the controller 530 may set the output frequencies of the PLLs 510 corresponding to the specific frequencies of the receivers. For example, when it is checked that the frequency maximizing the charging power of the first receiver is 5.8 GHz based on the RSSI of the first receiver, it is checked that the frequency maximizing the charging power of the second receiver is 4.8 GHz based on the RSSI of the second receive, and it is checked that the frequency maximizing the charging power of the third receiver is 6.8 GHz based on the RSSI of the third receiver, the controller 530 may set the output frequency of the first PLL 511 of the PLLs 510 to 5.8 GHz, set the output frequency of the second PLL 512 to 4.8 GHz, and set the output frequency of a third PLL 513 to 6.8 GHz.

Under control of the controller 530, the PLLs 510 may output (transfer) the power signals (having the same phase) having mutually different frequencies to the antennas 520. For example, the first PLL 511 may output the power signal 610 of 5.8 GHz, the second PLL 512 may output the power signal 620 of 4.8 GHz, and the third PLL 513 may output the power signal 630 of 6.8 GHz.

Therefore, each of the receivers may receive the power signal having the frequency maximizing the charging power, so that the charging efficiency is maximized.

When the frequencies maximizing the charging powers of the receivers are equal to each other (e.g., the case where the frequency for maximizing the charging power of the first receiver and the frequency for maximizing the charging power of the second receiver are equal to 5.8 GHz), the controller 530 may control the output frequency of each of the PLLs 510 as described with reference to FIG. 3.

For example, when the specific frequency for the first receiver is determined to be 5.8 GHz and the specific frequency for the second receiver is determined to be 5.8 GHz, the controller 530 may set the output frequency of the first PLL 511 corresponding to the first receiver and the output frequency of the second PLL 512 corresponding to the second receiver to be different from each other, instead of setting the output frequencies of the first and second PLLs 511 and 512 to be the same. As a more detailed example, after setting the output frequency of the first PLL 511 to 5.8 GHz, the controller 530 may set the output frequency of the second PLL 512 to 5.85 GHz in a preset specific frequency band (5.7 GHz to 5.9 GHz), based on the specific frequency of 5.8 GHz of the second receiver.

In addition, the controller 530 may determine the specific frequency for each of the receivers in the frequency band other than the frequency being used by each of the receivers by checking the information about the frequency in use included in the RSSI received from each of the receivers. In this case, likewise, the controller 530 may determine, as the specific frequency of each of the receivers, the frequency that maximizes the charging power of each receiver in the frequency band other than the frequency being used by each receiver.

The controller 530 may control the output frequency of each PLL 510 in various schemes. For example, in the case where each PLL 510 is a conventional PLL circuit which oscillates at an output frequency coinciding with an input frequency, the controller 530 may control the input frequencies of the PLLs 510 to be different from each other, such that the output frequencies of the PLLs 510 are set to be different from each other in a specific frequency band. As another example, in the case where each PLL 510 is a circuit that oscillates at an output frequency regardless of an input frequency, the controller 530 may transmit a control signal associated with information about a specific frequency band to each PLL 510, such that the output frequencies of the PLLs 510 are set to be different from each other in the specific frequency band. The detailed description of the circuit of each PLL 510 will be omitted because it is outside the technical scope of the inventive concept.

The antennas 520 transmit power signals (which have the same phase and mutually different frequencies such that the power signals correspond to the specific frequencies of the receivers), which are transmitted from the PLLs 510, to the receivers, respectively. Thus, the number of the antennas 520 may correspond to the number of the PLLs 510. In this case, each antenna 520 may include a matching unit corresponding to each PLL 510.

Although the embodiment including three PLLs 510 and three antennas 520 has been described above, the embodiment is not limited thereto and the transmitter 500 may be composed of at least two or more PLLs and antennas.

In addition, although not illustrated in the drawings, the transmitter 500 may further include a communication antenna for receiving the RSSI from each of the receivers. In this case, the transmitter 500 may receive the RSSI from each of the receivers through the communication antenna and transmit the power signals to the receivers through the antennas 520. However, the embodiment is not limited thereto, and the transmitter 500 may use one of the antennas 520 as the communication antenna and may use the other antennas to transmit the power signals to the receivers.

In addition, although not illustrated in the drawings, the transmitter 500 may further include at least one power amplifier arranged between the PLLs 510 and the antennas 520 to amplify the power signals transmitted from the PLLs 510. For example, the transmitter 500 may include one power amplifier configured to amplify the power signals transmitted from the PLLs 510, but the embodiment is not limited thereto and the transmitter 500 may include a plurality of power amplifiers that correspond to the PLLs 510, respectively.

As described above, the difference between the transmitter 500 included in the wireless charging system according to another embodiment and the transmitter illustrated in FIG. 2 is that the transmitter 500 transmits power signals having mutually different frequencies to the receivers, respectively (where the transmitter illustrated in FIG. 2 transmits power signals having mutually different frequencies to one receiver). However, the embodiment is not limited thereto. The transmitter 500 may include a larger number of PLLs 510 and a plurality of antennas 520 such that the operating characteristics of the transmitter illustrated in FIG. 2 are applied thereto. For example, the transmitter 500 may transmit power signals having mutually different frequencies for each of the receivers. That is, the transmitter 500 transmits a power signal having a first frequency and a power signal having a second frequency to a first receiver, and a power signal having a third frequency and a power signal having a fourth frequency to a second receiver.

The foregoing devices may be realized by hardware elements, software elements and/or combinations thereof. For example, the devices and components illustrated in the exemplary embodiments of the inventive concept may be implemented in one or more general-use computers or special-purpose computers, such as a processor, a controller, an arithmetic logic unit (ALU), a digital signal processor, a microcomputer, a field programmable gate array (FPGA), a programmable logic unit (PLU), a microprocessor or any device which may execute instructions and respond. A processing unit may implement an operating system (OS) or one or software applications running on the OS. Further, the processing unit may access, store, manipulate, process and generate data in response to execution of software. It will be understood by those skilled in the art that although a single processing unit may be illustrated for convenience of understanding, the processing unit may include a plurality of processing elements and/or a plurality of types of processing elements. For example, the processing unit may include a plurality of processors or one processor and one controller. Also, the processing unit may have a different processing configuration, such as a parallel processor.

Software may include computer programs, codes, instructions or one or more combinations thereof and may configure a processing unit to operate in a desired manner or may independently or collectively control the processing unit. Software and/or data may be permanently or temporarily embodied in any type of machine, components, physical equipment, virtual equipment, computer storage media or units or transmitted signal waves so as to be interpreted by the processing unit or to provide instructions or data to the processing unit. Software may be dispersed throughout computer systems connected via networks and may be stored or executed in a dispersion manner. Software and data may be recorded in one or more computer-readable storage media.

The methods according to the above-described exemplary embodiments of the inventive concept may be implemented with program instructions which may be executed through various computer means and may be recorded in computer-readable media. The media may also include, alone or in combination with the program instructions, data files, data structures, and the like. The program instructions recorded in the media may be designed and configured specially for the exemplary embodiments of the inventive concept or be known and available to those skilled in computer software. Computer-readable media include magnetic media such as hard disks, floppy disks, and magnetic tape; optical media such as compact disc-read only memory (CD-ROM) and digital versatile discs (DVDs); magneto-optical media such as floptical disks; and hardware devices that are specially configured to store and perform program instructions, such as read-only memory (ROM), random access memory (RAM), flash memory, and the like. Program instructions include both machine codes, such as produced by a compiler, and higher level codes that may be executed by the computer using an interpreter. The described hardware devices may be configured to act as one or more software modules to perform the operations of the above-described exemplary embodiments of the inventive concept, or vice versa.

According to the embodiments, there are provided a transmitter which controls a power signal in consideration of the charging efficiency of a receiver such that the power signal has a frequency suitable for the receiver, and a wireless charging system including the same.

In detail, according to the embodiments, there are provided a transmitter and a wireless charging system including the same, where the transmitter determines a specific frequency for a receiver based on a received signal strength indication (RSSI) received from the receiver, and controls output frequencies of a plurality of PLLs included in the transmitter in a specific frequency band preset based on a specific frequency, such that the output frequencies are different from each other to transmit power signals having mutually different frequencies to the receiver.

Specifically, according to the embodiments, there are provided a transmitter that sets output frequencies of a plurality of PLLs to different stepped values in a specific frequency band, and a wireless charging system including the same.

In this case, according to the embodiments, there are provided a transmitter that determines a specific frequency based on the frequency that maximizes the charge power of a receiver or based on information about the frequency that the receiver is using, and a wireless charging system including the same.

In addition, according to the embodiments, there are provided a transmitter that is arranged based on a position or shape of a structure in a space such that power signals are reflected and transmitted to a receiver, and a wireless charging system including the same.

Therefore, according to the embodiments, there is provided a wireless charging technology that maximizes the charging efficiency of a wireless charging receiver.

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Thus, it is intended that the inventive concept covers other realizations and other embodiments of this invention provided they come within the scope of the appended claims and their equivalents.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A transmitter used for a wireless charging system, the transmitter comprising:
   a plurality of phase locked loops (PLLs) configured to output single-phase power signals;
   a plurality of antennas configured to transmit the power signals transmitted from the plurality of PLLs to a receiver; and
   a controller configured to determine a specific frequency for the receiver based on a signal strength indication (RSSI) received from the receiver and to allow output frequencies of the plurality of PLLs to be different from each other in a specific frequency band preset based on the specific frequency, wherein the output frequencies of the plurality of PLLs are different from each other in the specific frequency band without regard to an input frequency.

2. The transmitter of claim 1, wherein the output frequencies of the plurality of PLLs are set to different stepped values in the specific frequency band.

3. The transmitter of claim 1, wherein the plurality of PLLs output the power signals having mutually different frequencies corresponding to the output frequencies which are controlled by the controller such that the output frequencies are different from each other.

4. The transmitter of claim 1, wherein the controller determines, as the specific frequency, a frequency that maximizes a charging power of the receiver, based on the RSSI.

5. The transmitter of claim 1, wherein the controller determines the specific frequency based on information about a frequency being used by the receiver, and
   wherein the information is included in the RSSI.

6. The transmitter of claim 5, wherein the controller determines, as the specific frequency, a frequency that maximizes a charging power of the receiver in a frequency band other than the frequency being used by the receiver.

7. The transmitter of claim 1, wherein the controller controls input frequencies of the plurality of PLLs such that the output frequencies of the plurality of PLLs are different from each other in the specific frequency band.

8. The transmitter of claim 1, further comprising:
   a communication antenna configured to receive the RSSI from the receiver.

9. The transmitter of claim 1, further comprising:
   at least one power amplifier arranged between the plurality of PLLs and the plurality of antennas to amplify the power signals transmitted from the plurality of PLLs.

10. The transmitter of claim 1, wherein the transmitter is arranged based on a location and a shape of a structure in a space in which the transmitter exists, such that the power signals are reflected on the structure and transmitted to the receiver.

11. A transmitter used for a wireless charging system, the transmitter comprising:
    a plurality of phase locked loops (PLLs) configured to output single-phase power signals;
    a plurality of antennas configured to transmit the power signals transmitted from the plurality of PLLs to a plurality of receivers; and
    a controller configured to determine a specific frequency for each of the plurality of receivers based on a signal strength indication (RSSI) received from each of the plurality of receivers and to allow output frequencies of the plurality of PLLs to be different from each other in a specific frequency band preset based on the specific frequencies of the plurality of receivers, wherein the output frequencies of the plurality of PLLs are different from each other in the specific frequency band without regard to an input frequency.

12. The transmitter of claim 11, wherein the controller determines, as the specific frequencies of the plurality of receivers, frequencies that respectively maximize charging powers of the plurality of receivers, based on the RSSIs.

13. The transmitter of claim 11, wherein the controller determines the specific frequency of each of the plurality of receivers based on a frequency being used by each of the plurality of receivers included in the RSSI.

* * * * *